(12) United States Patent
Choi et al.

(10) Patent No.: US 7,898,881 B2
(45) Date of Patent: Mar. 1, 2011

(54) SEMICONDUCTOR MEMORY DEVICE AND DATA SENSING METHOD THEREOF

(75) Inventors: Jung-Hwa Choi, Daegu-si (KR); Byung-Sik Moon, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 226 days.

(21) Appl. No.: 12/219,494

(22) Filed: Jul. 23, 2008

(65) Prior Publication Data

US 2009/0027979 A1 Jan. 29, 2009

(30) Foreign Application Priority Data

Jul. 23, 2007 (KR) .................. 10-2007-0073599

(51) Int. Cl.
*G11C 7/00* (2006.01)

(52) U.S. Cl. ......... 365/196; 365/191; 365/202; 365/207; 365/230.06

(58) Field of Classification Search .......... 365/196, 365/191, 202, 207, 230.06
See application file for complete search history.

(56) References Cited

U.S. PATENT DOCUMENTS

| | | | | |
|---|---|---|---|---|
| 4,926,384 A | * | 5/1990 | Roy .................. | 365/230.03 |
| 4,948,993 A | * | 8/1990 | Chin et al. .................. | 327/51 |
| 5,293,348 A | * | 3/1994 | Abe .................. | 365/230.03 |
| 5,412,604 A | * | 5/1995 | Fukuda et al. .................. | 365/189.11 |
| 5,471,425 A | * | 11/1995 | Yumitori et al. .................. | 365/190 |
| 5,473,562 A | * | 12/1995 | Liu .................. | 365/154 |
| 5,566,112 A | * | 10/1996 | Lysinger .................. | 365/196 |
| 5,706,229 A | * | 1/1998 | Yabe et al. .................. | 365/189.05 |
| 5,883,851 A | * | 3/1999 | Lee .................. | 365/230.03 |
| 5,986,966 A | | 11/1999 | Nagata | |
| 5,991,223 A | * | 11/1999 | Kozaru et al. .................. | 365/230.03 |
| 6,026,042 A | * | 2/2000 | Shirley et al. .................. | 365/210.12 |
| 6,072,774 A | * | 6/2000 | Natarajan et al. .................. | 370/231 |
| 6,075,736 A | * | 6/2000 | Kim et al. .................. | 365/207 |
| 6,147,915 A | * | 11/2000 | Yanagisawa et al. .................. | 365/194 |
| 6,147,919 A | * | 11/2000 | Kawabata et al. .................. | 365/208 |
| 6,205,068 B1 | * | 3/2001 | Yoon .................. | 365/203 |
| 6,563,748 B2 | * | 5/2003 | Hidaka .................. | 365/198 |
| 6,614,702 B2 | * | 9/2003 | Lee .................. | 365/205 |
| 6,707,729 B2 | * | 3/2004 | Schreck .................. | 365/196 |
| 6,785,157 B2 | * | 8/2004 | Arimoto et al. .................. | 365/149 |
| 6,859,405 B2 | * | 2/2005 | Lee et al. .................. | 365/205 |
| 6,967,880 B2 | * | 11/2005 | Park .................. | 365/201 |
| 7,154,775 B2 | | 12/2006 | Shimizu et al. | |
| 7,193,925 B2 | * | 3/2007 | Hong .................. | 365/230.06 |
| 7,542,328 B2 | * | 6/2009 | Lee et al. .................. | 365/149 |

FOREIGN PATENT DOCUMENTS

| | | |
|---|---|---|
| JP | 06-036599 | 2/1994 |
| JP | 10-283778 | 10/1998 |
| JP | 2004-046949 | 2/2004 |
| KR | 10-2000-0037986 A | 7/2000 |

* cited by examiner

*Primary Examiner* — Viet Q Nguyen
(74) *Attorney, Agent, or Firm* — Lee & Morse, P.C.

(57) ABSTRACT

A semiconductor memory device includes first and second edge drivers configured to generate sensing control signals, a memory cell array between first and second edge drivers, and pluralities of unit sense amplifiers detecting data from the memory cell array in response to the sensing control signals.

12 Claims, 5 Drawing Sheets

SEMICONDUCTOR MEMORY DEVICE AND DATA SENSING METHOD THEREOF

BACKGROUND OF THE INVENTION

1. Field of the Invention

Embodiments relate to semiconductor memory devices. More particularly, embodiments relate to a semiconductor memory device and a data sensing method thereof.

2. Description of the Related Art

A unit cell of a dynamic random access memory (DRAM) is formed of one transistor and one capacitor. Due to their structural simplicity, DRAMs are widely used for semiconductor storage devices requiring a high integration density. However, due to charge leakage through the capacitor and transistor therein, the DRAM should be periodically refreshed for retaining its data.

In addition to a refresh operation, the DRAM may also perform writing and reading operations. The writing operation stores data in the unit cells and the reading operation retrieves data stored in the unit cells. It is well known that those operations are conducted using sense amplifiers.

The sense amplifiers operate in response to externally provided sensing control signals. The sensing control signals are generated by an edge driver included in a row decoder.

The DRAM also has a memory cell array to store all data up to a given design capacity. The row decoder is placed at one side of the memory cell array, which may cause a difference of signal propagation in transferring the sensing control signals to the sense amplifiers from the row decoder. For example, the sensing control signals arrive earlier at the sense amplifiers closer to the row decoder than to the sense amplifiers further from the row decoder. This effect is called 'sensing skew'. It is desirable to reduce or eliminate such a sensing skew in the DRAM.

SUMMARY OF THE INVENTION

Embodiments are directed to a semiconductor memory device and a data sensing method, which substantially overcome one or more of the disadvantages of the related art.

Embodiments may provide a semiconductor memory device and a data sensing method operating at high rate and having a reduced sensing skew.

At least one of the above and other advantages may be realized by providing a semiconductor memory device including first and second edge drivers configured to generate sensing control signals, a memory cell array interposed between the first and second edge drivers, and pluralities of unit sense amplifiers detecting data from the memory cell array in response to the sensing control signals.

In an embodiment, the semiconductor memory device may further include a control logic circuit configured to generate a sense amplifier drive signal in response to an external command and a row decoder configured to generate a block selection signal in response to a row address. The sensing control signals may be activated if the sense amplifier drive signal and the block selection signal are all activated.

In an embodiment, the first edge driver may be included in the row decoder.

In an embodiment, each unit sense amplifier may respond to the sensing control signals from a closer one of the first and second edge drivers.

In an embodiment, each unit sense amplifier may be connected to a unit memory cell of the memory cell array through a bit line.

In an embodiment, the unit memory cell may be a dynamic random access memory cell.

At least one of the above and other advantages may be realized by providing a data sensing method for a semiconductor memory including generating sensing control signals from first and second edge drivers disposed on either side of a memory cell array, selecting a bit line corresponding to a memory cell coupled to a selected word line, and sensing a voltage from the bit line using a unit sense amplifier of a plurality of unit sense amplifiers in response to the sensing control signals.

In an embodiment, the method may further include generating a sense amplifier drive signal for the unit sense amplifier in response to an external command and generating a block selection signal in response to a row address. The sensing control signals may be activated if the sense amplifier drive signal and the block selection signal are all activated.

In an embodiment, the first edge driver may be included in the row decoder.

In an embodiment, each unit sense amplifier may respond to the sensing control signals from a closer one of the first and second edge drivers.

In an embodiment, the unit sense amplifiers may be connected to unit memory cells of the memory cell array through bit lines.

In an embodiment, the unit memory cell may be a dynamic random access memory cell.

At least one of the above and other advantages may be realized by providing a processor system including a processor configured to data and a semiconductor memory device configured to store processed data output by the processor. The semiconductor memory device includes first and second edge drivers configured to generate sensing control signals, a memory cell array disposed between first and second edge drivers, and pluralities of unit sense amplifiers configured to detect data from the memory cell array in response to the sensing control signals.

In an embodiment, the semiconductor memory device may be a dynamic random access memory.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2007-73599, filed on Jul. 23, 2007, in the Korean Intellectual Property Office, and entitled: "Semiconductor Memory Device and Data Sensing Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
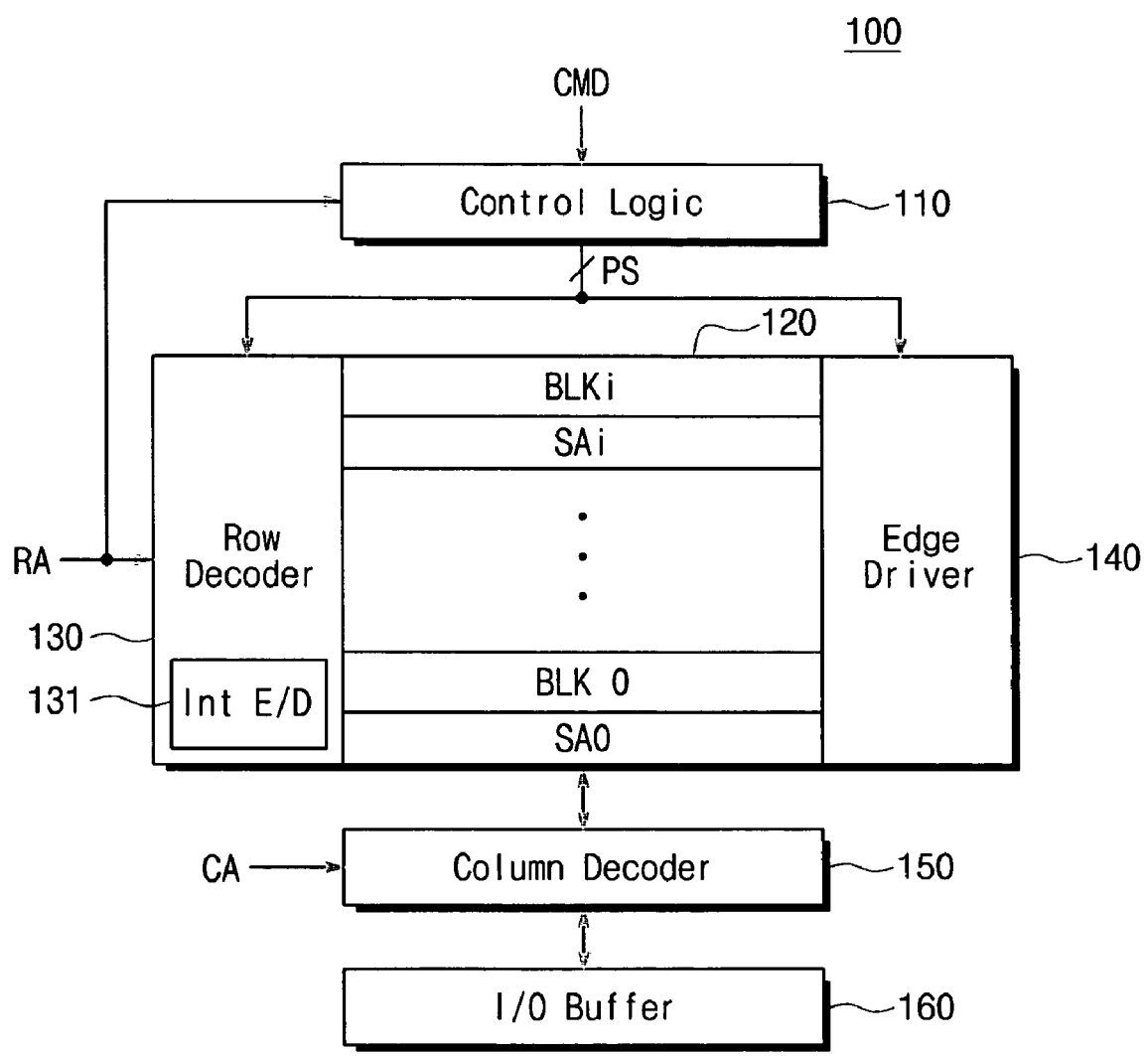
FIG. 1 illustrates a block diagram of a semiconductor memory device according to an embodiment.

FIG. 1 illustrates a block diagram of a semiconductor memory device 100 according to an embodiment. Referring to FIG. 1, the semiconductor memory device 100 may include a control logic circuit 110, a memory cell array 120, a row decoder 130, an edge driver block 140, a column decoder 150, and an input/output (I/O) buffer 160. The row decoder 130 may include an internal edge driver 131.

The control logic circuit 110 may control general operations of the semiconductor memory device 100 in response to an external command. Such an external command may be, e.g., a refresh command, a writing command, a reading command, and so forth. For example, the control logic circuit 110 may enable the row decoder 130 to selectively activate a word line, a sense amplifier to sense and amplify a bit line, and the column decoder 150 to transfer a voltage of a selected bit line toward the I/O buffer 160, in response to the reading command.

The memory cell array 120 may include pluralities of memory blocks BLK0~BLKi. Although not shown, each memory block may include plural memory cells arranged in a matrix of rows and columns. Sense amplifier circuits SA0~SAi for detecting data from the memory cells may be arranged to correspond to respective memory blocks BLK0~BLKi. The sense amplifier circuits SA0~SAi may sense and amplify bit line voltages in response to sensing control signals provided from the row decoder 130 and the edge driver block 140.

The row decoder 130 may selectively activate a word line in response to a row address RA. The internal edge driver 131 may generate the sensing control signals in response to the row address RA and a control signal PS provided from the control logic circuit 110.

The edge driver block 140 may generate the sensing control signals in response to the control signal PS provided from the control logic circuit 110 and a block selection signal BSi provided from the row decoder 130. Although not shown in FIG. 1, the edge driver block 140 may be arranged for each respective memory block. A structure of the edge driver block 140 according to an embodiment will be described in detail later with reference to FIG. 3.

The column decoder 150 may select a bit line in response to a column address CA. A voltage of a selected bit line may be transferred to the I/O buffer 160. The I/O buffer 160 may output data to an external device (e.g., a host) according to a bit line voltage input thereto.

Figure 2:
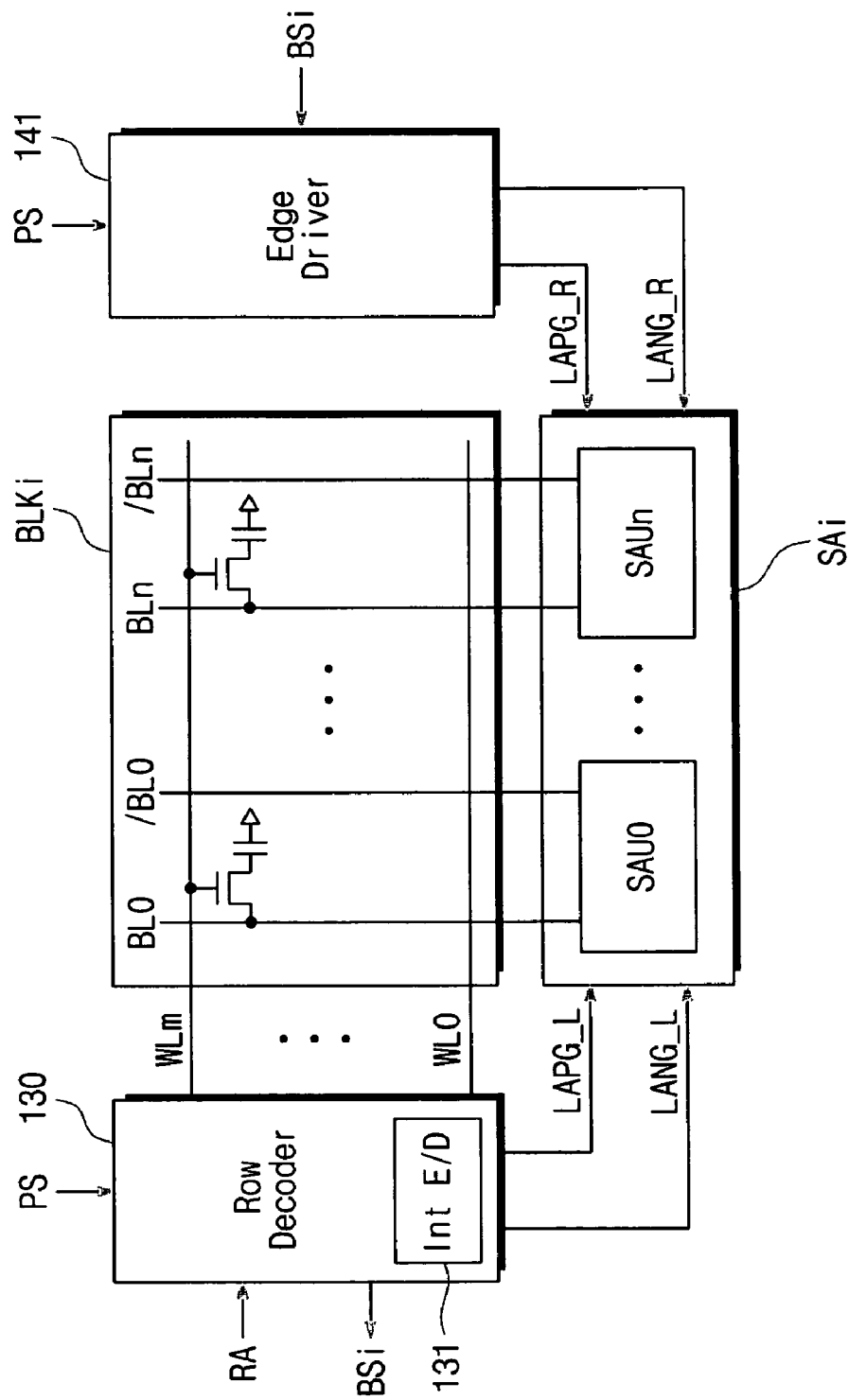
FIG. 2 illustrates a block diagram of the disposition of a memory block and a unit sense amplifier illustrated in FIG. 1 according to an embodiment.

FIG. 2 illustrates a block diagram of the memory block BLKi and the sense amplifier circuit SAi shown in FIG. 1.

Referring to FIG. 2, the memory block BLKi may be connected to the row decoder 130 through word lines WL0~WLm. The word lines WL0~WLm may be selectively activated by the row decoder 130. The memory block BLKi may be connected to the sense amplifier circuit SAi through bit lines BL0~BLn. As illustrated in FIG. 2, the word and bit lines, WL0~WLm and BL0~BLn, form a matrix array of rows and columns.

A unit memory cell of DRAM may be formed of one transistor and one capacitor. As shown in FIG. 2, a gate of a transistor may be coupled to a corresponding word line WL0~WLm. A drain of the transistor may be connected to a corresponding bit line BL0~BLn. A source of the transistor may be connected to an electrode of a capacitor, while another electrode of the capacitor may be grounded.

The sense amplifier circuit SAi may include pluralities of unit sense amplifiers SAU0~SAUn. A pair of bit lines BL and /BL may be connected to each unit sense amplifier SAU. Each unit sense amplifier SAU may operate to detect and amplify a voltage of its corresponding bit line pair in response to the sensing control signals LAPG_L and LANG_L from the internal edge driver 131 or the sensing control signals LAPG_R and LANG_R from the edge driver 141.

The edge driver block 140 may include pluralities of edge drivers. Each edge driver 141 of the edge driver block 140 may be provided corresponding to each memory block BLKi. The edge driver 141 may respond to the control signal PS and the block selection signal BSi. The block selection signal BSi may be activated in response to the row address RA. For instance, the block selection signal BSi may be activated when the row address RA designates a word line WL0~WLm coupled to the memory block BLKi. The unit sense amplifiers SAU0~SAUn may respond to the sensing control signals LAPG_L, LANG_L, LAPG_R, and LANG_R. The control signal PS may be activated when operation of the unit sense amplifier SAU is needed.

The internal edge driver 131 of the row decoder 130 may generate the sensing control signals LAPG_L and LANG_L in response to the row address RA and the control signal PS. The edge driver 141 may generate the sensing control signals LAPG_R and LANG_R in response to the block selection signal BSi and the control signal PS. The block selection signal BSi may be activated when a word line coupled to the memory block BLKi is selected. For example, when the row address RA designated the word line assigned to the memory block BLKi, the block selection signal BLKi is activated.

Figure 3:
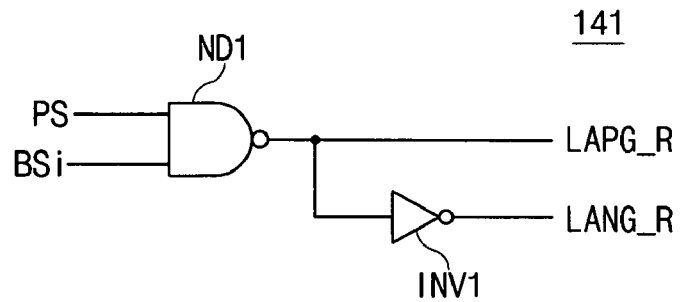
FIG. 3 illustrates a circuit diagram of the edge driver in FIG. 2 according to an embodiment.

FIG. 3 illustrates a circuit diagram of the edge driver 141 shown in FIG. 2 according to an embodiment. Referring to FIG. 3, the edge driver 141 may include a 2-input NAND gate ND1 and an inverter INV1. The block selection signal BSi from the row decoder 130 and the control signal PS from the control logic circuit 110 may be input to the NAND gate ND1. An output of the NAND gate ND1 may serve as the sensing control signal LAPG_R. An inverted output of the NAND gate ND1, i.e., an output of the inverter INV1, may serve as the sensing control signal LANG_R.

If the control signal PS and the block selection signal BLKi are all logic high, the sensing control signal LAPG_R may be logic low, while LANG_R may be logic high. Then, the unit sense amplifier SAU begins to sense and amplify a voltage of the bit line. Otherwise, when the sensing control signals LAPG_R and LANG_R are logic high and low levels, respectively, operation of the unit sense amplifier SAU may be disabled.

Figure 4:
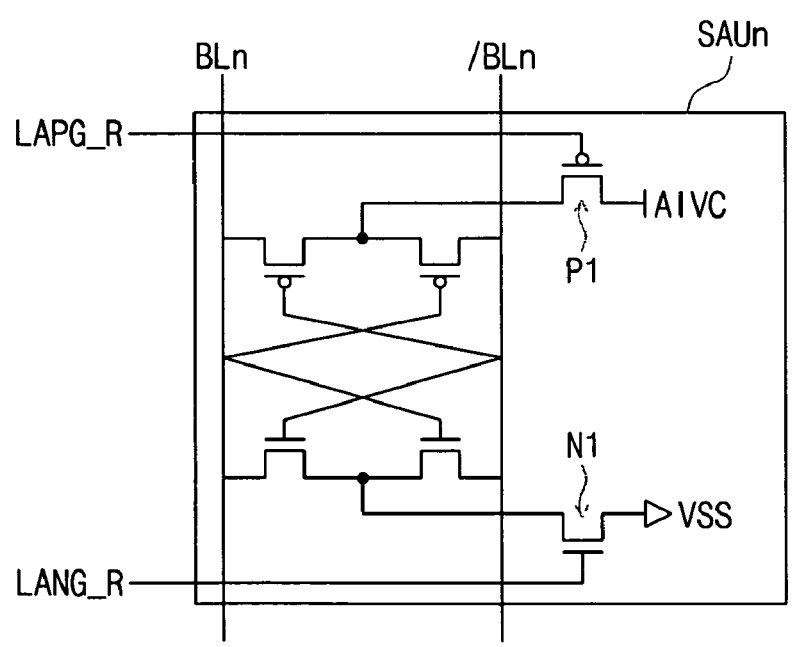
FIG. 4 illustrates a circuit diagram of the unit sense amplifier in FIG. 2 according to an embodiment.

FIG. 4 illustrates a circuit diagram of the unit sense amplifier SAU shown in FIG. 2 according to an embodiment. Each unit sense amplifier SAU0~SAUn may be the same in structure. Thus, FIG. 4 shows the structure of the unit sense amplifier SAUn as a representative unit sense amplifier.

Referring to FIG. 4, the unit sense amplifier SAUn may respond to the sensing control signals LAPG_L and LANG_L provided from the internal edge driver 131 or to the sensing control signals LAPG_R and LANG_R provided from the edge driver 141. For this particular representative example, since the unit sense amplifier SAUn is closer to the edge driver 141, the sensing control signals LAPG_R and LANG_R from the edge driver 141 will arrive there before the sensing control signals LAPG_L and LANG_L from the edge driver 131. Thus, the unit sense amplifier SAUn may be controlled by the sensing control signals LAPG_R and LANG_R.

In particular, the sensing control signal LAPG_R may be applied to a gate of a PMOS transistor P1, while the sensing control signal LANG_R may be applied to a gate of an NMOS transistor N1. As shown in FIG. 4, a source of the PMOS transistor P1 may be supplied with an internal power voltage AIVC and a source of the NMOS transistor N1 may be supplied with a ground voltage VSS.

If the sensing control signal LAPG_R is logic low and the sensing control signal LANG_R is logic high, the PMOS and NMOS transistors P1 and N1 are all turned on. Then, voltage variation of the bit line pair, i.e., BLn and /BLn, may be sensed and amplified. In the other cases, the PMOS and NMOS transistors are all turned off, so there is no sensing and amplification for the voltage variation of the bit line pair. As such an operation of the unit sense amplifier SAUn is well known, it will not be described in further detail.

Figure 5:
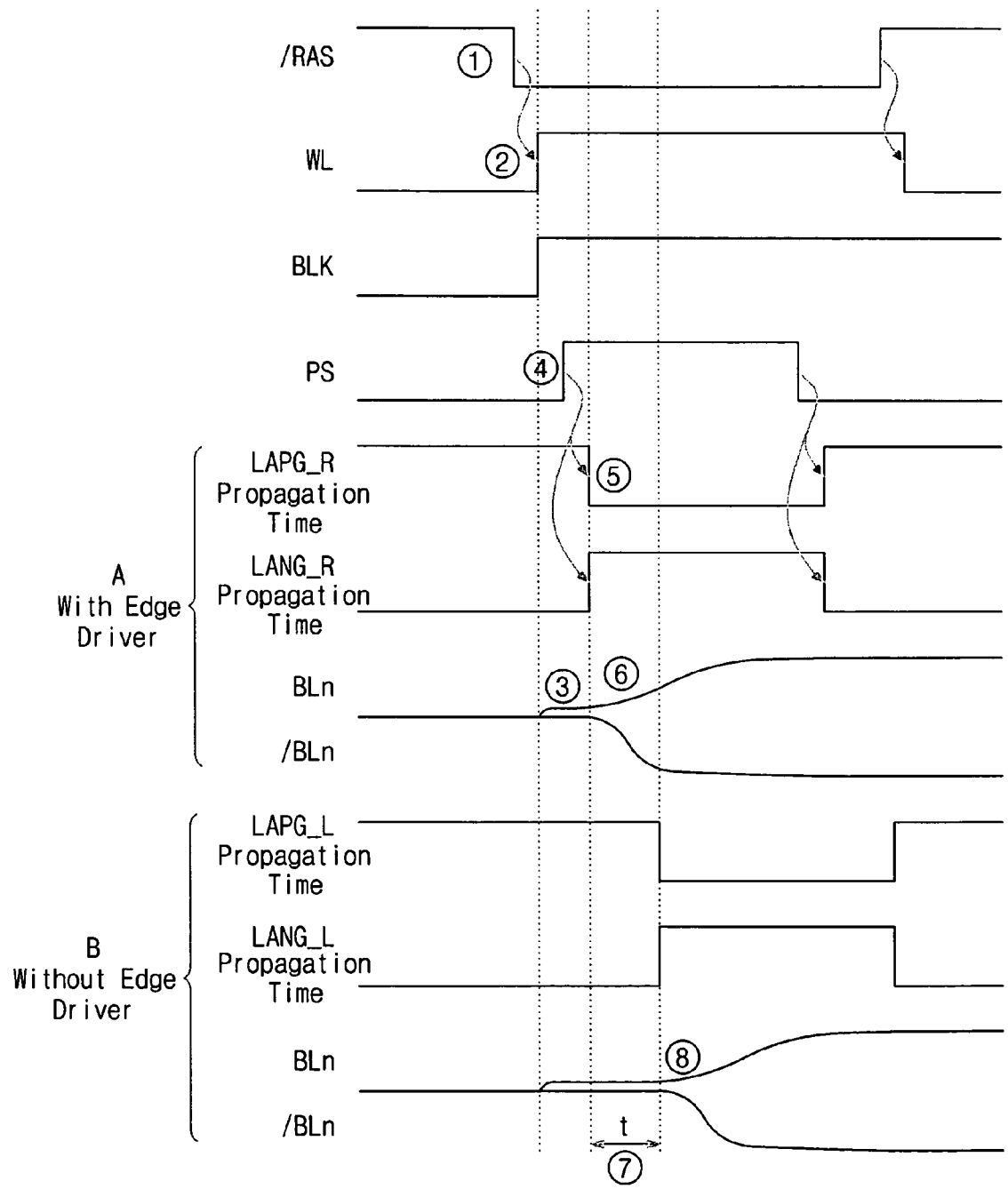
FIG. 5 illustrates a timing diagram of a data sensing method of the semiconductor memory device in accordance with an embodiment.

FIG. 5 illustrates a timing diagram of a data sensing method of the semiconductor memory device 100 according to an embodiment. Hereinafter, the data sensing operation of the semiconductor memory device 100 will be described in conjunction with FIGS. 1 through 5. While the timing diagram in FIG. 5 illustrates a reading mode, the semiconductor memory device 100 according an embodiment may operate in a similar fashion as the reading mode when in a refreshing mode, a writing mode, and so forth. Here, it is assumed that the sense amplifier exemplarily used in this embodiment is the unit sense amplifier SAUn closest to the edge driver 141.

Case A of FIG. 5 shows a sequence of the reading operation using sensing control signals from the edge driver 141 according to an embodiment. For comparison to the case A, case B of FIG. 5 shows a sequence of the reading operation without the edge driver 141, i.e., using sensing control signals from the row decoder 130.

As shown in the case A of FIG. 5, the reading operation according to an embodiment may begin in response to activation of a row address strobe signal /RAS. The row address strobe signal /RAS is activated (①) to accept the row address RA. In response to the row address strobe signal /RAS, the row address RA may be input to the row decoder 130. The row decoder 130 may activate a selected word line (②) corresponding to the row address RA.

When the selected word line is activated, the transistor of the memory cell coupled to the selected word line is turned on. Then, a voltage of the bit line BLn may be determined in accordance with presence of charges in the memory cell (③). For instance, if charges are stored in the memory cell, the voltage of the bit line BLn may increase slightly. In contrast, if no charges are stored in the memory cell, the voltage of the bit line BLn does not change. Since this voltage variation on the bit line pair may be small, a difference between the bit lines BLn and /BLn may be amplified.

In order to activate the unit sense amplifier SAUn, the control logic circuit 110 may apply the control signal PS at a high level to the internal edge driver 131 and the edge driver 141 (④). Additionally, the block selection signal BSi may be applied to the internal edge driver 131 and the edge driver 141. When the control signal PS and the block selection signal BSi are logic high, the internal edge driver 131 and the edge driver 141 may output the sensing control signals LAPG_L, LANG_L, LAPG_R, and LANG_R, respectively. In particular, the sensing control signals LAPG_R and LAPG_L may be logic low while the sensing control signals LANG_R and LANG_L are logic high.

The unit sense amplifier SAUn may operate to sense and amplify the bit line voltage in response to the sensing control signals LAPG_L, LANG_L, LAPG_R, and LANG_R. Since the unit sense amplifier SAUn is closer to the edge driver 141, the sensing control signals LAPG_R and LANG_R arrive earlier than the sensing control signals LAPG_L and LANG_L (⑤). Thus, the unit sense amplifier SAUn may start sensing and amplifying operations before the sensing control signals LAPG_L and LANG_L arrive (⑥). The bit line voltage developed and amplified by the unit sense amplifier SAUn may be selectively transferred to the I/O buffer 160 by the column decoder 150.

Otherwise, referring to the case B of FIG. 5, when the unit sense amplifier SAUn, which is removed from the internal edge driver 131, operates in response to the sensing control signals LAPG_L and LANG_L output from the internal edge driver 131, the unit sense amplifier SAUn receives the sensing control signals LAPG_L and LANG_L later than another unit sense amplifier that is closer to the internal edge driver 131 (⑦). Thus, the unit sense amplifier SAUn is activated in the case B later than in the case A (⑧).

As aforementioned, each unit sense amplifier SAU may operate in response to the sensing control signals LAPG_L and LANG_L provided from the internal driver 131 of the row decoder 130 or the sensing control signals LANG_R and LANG_R provided from the edge driver 141. Thus, relative to the case B, in which the sensing control signals are generated only by the row decoder 130, the case A according to an embodiment decreases a propagation time for the sensing control signals to arrive at the unit sense amplifier SAUn. According to an embodiment, since the unit sense amplifier SAUn is able to receive the sensing control signals LAPG_R and LANG_R from the edge driver 140 that is relatively closer thereto, the propagation time of the sensing control signals may be reduced.

The effect of reducing the propagation time of the sensing control signals may enhance operational performance in the refreshing, writing and/or reading operation. Consequently, the sensing skew that arising from positional differences of the unit sense amplifiers may be reduced or eliminated, improving the operational reliability of the semiconductor memory device (i.e., DRAM device).

Figure 6:
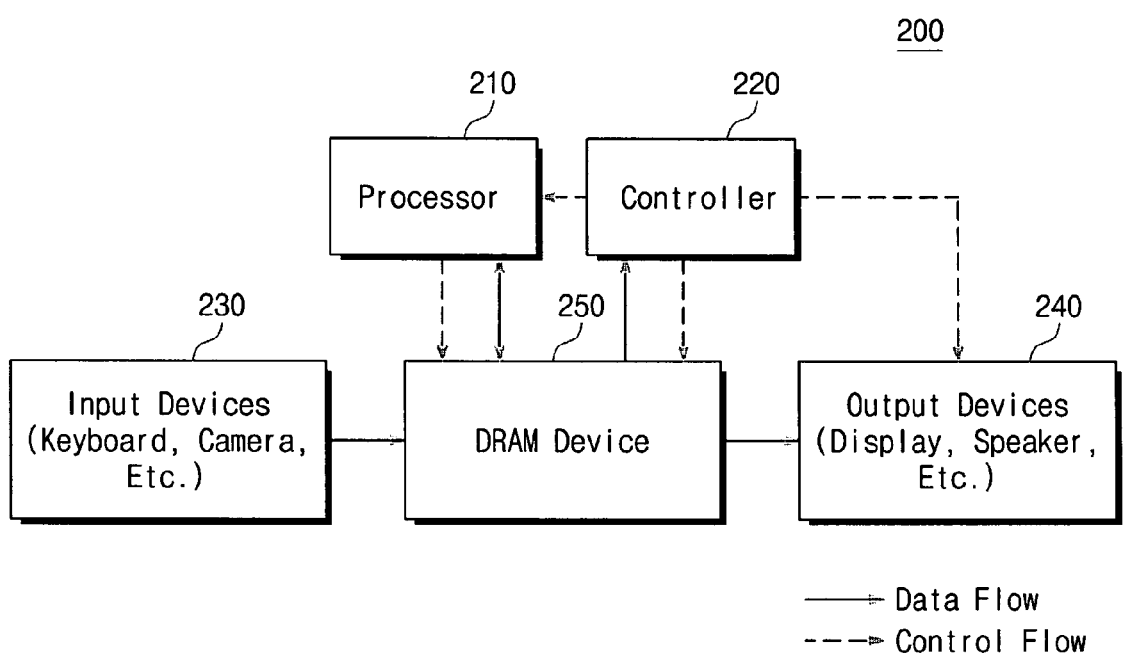
FIG. 6 illustrates a block diagram of a computing system including the semiconductor memory device in accordance with an embodiment.

FIG. 6 illustrates a block diagram of a processor system 200 including the semiconductor memory device (e.g., DRAM device) according to an embodiment. Referring to FIG. 6, the processor system 200 may include a processor 210, a controller 220, input devices 230, output devices 240, and a DRAM device 250. Solid lines denote data flows and dashedlines denote control signal flows.

In the processor system 200 according to an embodiment, data may be input through the input devices 230 (e.g., keyboard, camera, etc.). Input data may be, e.g., commands by users, multimedia data, such as image data from cameras, and so forth. Such input data may be stored in the DRAM device 250.

The controller 220 may operate to control the components of the processor system 200 in response to commands stored in the DRAM device 250. The processor 210 may conduct processing operations in response to outputs of the controller 220. Processed results may be stored in the DRAM device 250. The output devices 240 may operate to output data from the DRAM device 250 in response to outputs of the controller 220. The output devices 240 may provide perceptible patterns for users. For example, the output device 240 may include a display device and/or a speaker, and so forth.

The DRAM device 250 may operate as that shown in FIG. 1 in substance. The DRAM device 250 may store N-bit data (N is a positive integer) which has been processed or will be processed by the processor 210 under control of the controller 220.

Although not shown in FIG. 6, it should be understood by those skilled in the art that a power supply unit may be provided for the processor system 200. If the processor system 200 is within a mobile apparatus, the power supply unit may include a battery (also not shown). Due to the enhanced operation rate and reliability of the DRAM device 250, the processor system 200 may provide improved operation rate and reliability.

According to an embodiment, the sensing skew may be reduced to enhance an operation rate of the semiconductor memory device. Moreover, the reduced sensing skew may allow the reliability of operation in the semiconductor memory device to be improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device comprising:
    first and second edge drivers configured to generate sensing control signals;
    a memory cell array disposed between first and second edge drivers;
    pluralities of unit sense amplifiers configured to detect data from the memory cell array in response to the sensing control signals;
    a control logic circuit configured to generate a sense amplifier drive signal in response to an external command; and
    a row decoder configured to generate a block selection signal in response to a row address,
    wherein the sensing control signals are activated if the sense amplifier drive signal and the block selection signal are all activated.

2. The semiconductor memory device as claimed in claim 1, wherein the first edge driver is included in the row decoder.

3. The semiconductor memory device as claimed in claim 1, wherein each unit sense amplifier responds to the sensing control signals from a closer one of the first and second edge drivers.

4. The semiconductor memory device as claimed in claim 1, wherein each unit sense amplifier is connected to a unit memory cell of the memory cell array through a bit line.

5. The semiconductor memory device as claimed in claim 4, wherein the unit memory cell is a dynamic random access memory cell.

6. A data sensing method for a semiconductor memory device, the method comprising:
    generating sensing control signals from first and second edge drivers disposed on either side of a memory cell array;
    selecting a bit line corresponding to a memory cell coupled to a selected word line;
    sensing a voltage from the bit line using a unit sense amplifier of a plurality of unit sense amplifiers in response to the sensing control signals;
    generating a sense amplifier drive signal for the unit sense amplifier in response to an external command; and
    generating a block selection signal in response to a row address,
    wherein the sensing control signals are activated if the sense amplifier drive signal and the block selection signal are all activated.

7. The method as claimed in claim 6, wherein the first edge driver is included in the row decoder.

8. The method as claimed in claim 6, wherein each unit sense amplifier responds to the sensing control signals from a closer one of the first and second edge drivers.

9. The method as claimed in claim 6, each unit sense amplifier is connected to a corresponding unit memory cell of the memory cell array through corresponding bit lines.

10. The method as claimed in claim 9, wherein the unit memory cell is a dynamic random access memory cell.

11. A processor system, comprising:
    a processor configured to data; and
    a semiconductor memory device configured to store processed data output by the processor, the semiconductor memory device including
        first and second edge drivers configured to generate sensing control signals,
        a memory cell array disposed between first and second edge drivers,
        pluralities of unit sense amplifiers configured to detect data from the memory cell array in response to the sensing control signals;
        a control logic circuit configured to generate a sense amplifier drive signal in response to an external command; and
        a row decoder configured to generate a block selection signal in response to a row address,
        wherein the sensing control signals are activated if the sense amplifier drive signal and the block selection signal are all activated.

12. The processor system as claimed in claim 11, wherein the semiconductor memory device is a dynamic random access memory.

* * * * *